Aug. 23, 1966 HIROSHI KAMEI ET AL 3,268,772

PACKAGED ELECTRONIC EQUIPMENT

Filed March 26, 1963 3 Sheets-Sheet 1

INVENTORS
HIROSHI KAMEI
ROY J. HEBERT
BY RICHARD L. MAC GREGOR

L. Lee Humphries
ATTORNEY

Aug. 23, 1966 HIROSHI KAMEI ET AL 3,268,772

PACKAGED ELECTRONIC EQUIPMENT

Filed March 26, 1963 3 Sheets-Sheet 2

INVENTORS
HIROSHI KAMEI
ROY J. HEBERT
BY RICHARD L. MAC GREGOR
L. Lee Humphries
ATTORNEY

PACKAGED ELECTRONIC EQUIPMENT

Filed March 26, 1963 3 Sheets-Sheet 3

*INVENTORS*
HIROSHI KAMEI
ROY J. HEBERT
BY RICHARD L. MAC GREGOR
L. Lee Humphries
ATTORNEY United States Patent Office 3,268,772
Patented August 23, 1966

3,268,772
PACKAGED ELECTRONIC EQUIPMENT

Hiroshi Kamei, Downey, Roy J. Hebert, Garden Grove, and Richard L. MacGregor, Bellflower, Calif., assignors to North American Aviation, Inc.

Filed Mar. 26, 1963, Ser. No. 268,015
3 Claims. (Cl. 317—100)

This invention relates to a system for packaging electronic equipment and more particularly to a system for laterally supporting of and conducting heat from packaged electronic equipment.

Effective heat removal is required to maintain or permit reasonably low operating temperatures of the electrical components of packaged electronic systems to obtain good performance and reliability. Heat removal has oftentimes been accomplished by convection currents of air forced through the packaged equipment or it is done by conduction techniques or both. Expanded spacing, if package size is not a limitation, has also been used to limit the effects of heat generated by electronic components. At present, however, electronic technology is advancing into microminiaturization which includes micropackaging. Conductor and resistor patterns for electronic equipment and systems are made on inert substrates such as ceramic onto which discrete components such as diodes, transistors, capacitors, resistors, and other functional electronic blocks, which may be partial circuits fabricated as transistors, are placed and connected to the conductor and resistor patterns. An orderly arrangement of the printed circuits is necessary for economic and volume minimization and adequate provision must be made for heat removal and physical support so that the systems can operate reliably and withstand vibration and shock.

In the device of this invention, a system for effectively packaging printed circuits to maximize heat removal and to meet the requirements for structural support is comprised of arranging the printed circuit boards in orderly rows and columns with the printed circuits perpendicular to a printed circuit interconnecting board. The leads of the printed circuit board extending beyond one edge thereof are interconnected with the printed circuit interconnecting board. The leads interconnecting with the board extend through the interconnecting board and provide protruding leads which may be dip soldered or otherwise joined to the circuitry of the interconnecting board. The interconnecting boards or board with a number of printed circuit boards assembled to it comprises a board assembly of an electronic system. The board assembly plugs into a cold plate which has bonded to it in good thermal contact, spring heat conducting clips such that the edge opposite the electrical leads of each printed circuit board and along a medial plane insert into a clip. The cold plate may be the heat sink for several systems so assembled or may provide a thermal connection to a heat sink for several systems of a complete electronic package. The combination of interconnecting board and clip assembly provide lateral support of the printed circuit boards so that shock and vibration are more easily withstood.

Therefore, it is an object of this invention to provide a new and improved system for packaging electronic equipment.

It is another object of this invention to provide a system for effective packaging of microminiaturized electronic equipment.

It is still another object of this invention to provide a system for packaging electronic equipment in a micro package whereby heat removal and physical support are incorporated.

It is another object of this invention to provide a system for packaging microminiaturized electronic systems having new and improved heat removal connections and support connections.

Another object of this invention is to provide a system for conducting heat from a diminutive package of microminiaturized electronic systems.

Another object if this invention is to provide a system for supporting microminiaturized electronic systems packaged into a small package.

These and other objects of the invention will become apparent from the following description taken in connection with the accompanying drawings, in which FIG. 1 is an illustration of a plurality of microminiaturized printed circuit boards connected to an interconnecting board;

Figure 1:
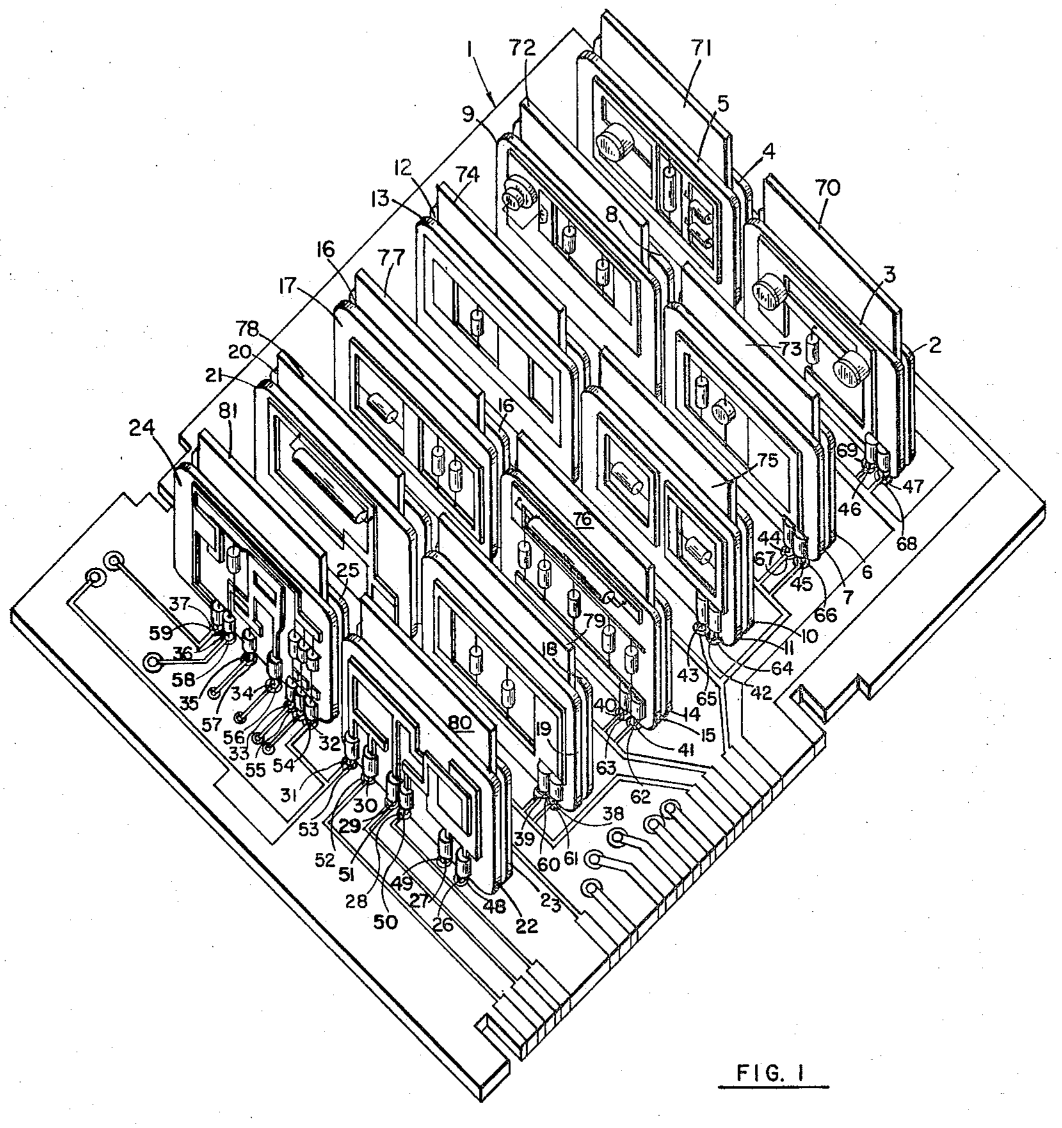

Referring now to FIG. 1 wherein is shown a plurality of microminiaturized circuit boards 2 through 25 connected by leads 26 through 47 and other leads not visible, to interconnecting board 1. Leads for each circuit board mate with perforations 48 through 69 and other perforations not visible. The connection is made by means such as dip soldering, etc. Interconnecting board 1, comprised of a material such as epoxy, epoxy glass, glass phenolic or other suitable material, has a circuit pattern affixed to the surface thereof for conducting electrical signals from one board to another or from another system to a board or the boards which comprise the system or partial system connected thereto. The pattern may be formed either by plating and etching techniques, deposition or other known processes. The microminiaturized circuit boards also have circuit patterns on their surfaces. For example a circuit board may be comprised of conductors, functional electronic blocks, etc., which in operation may generate excessive heat. One size of a microminiaturized board is ¾″ wide, 1½″ long and 0.035″ thick. The circuit board may be comprised of a ceramic of high heat conductivity, for example alumina or beryllia, as distinguished from glass or steatite.

Figure 4C:
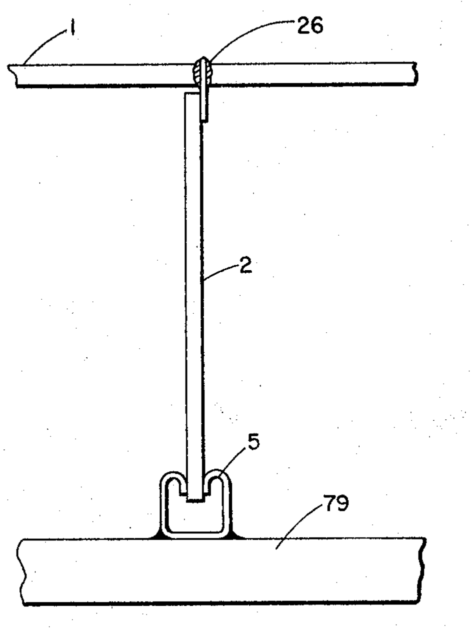
FIGS. 4*a*, 4*b*, and 4*c* illustrate different structural arrangements for conducting heat from an electronic system to a heat sink.
Figure 4B:
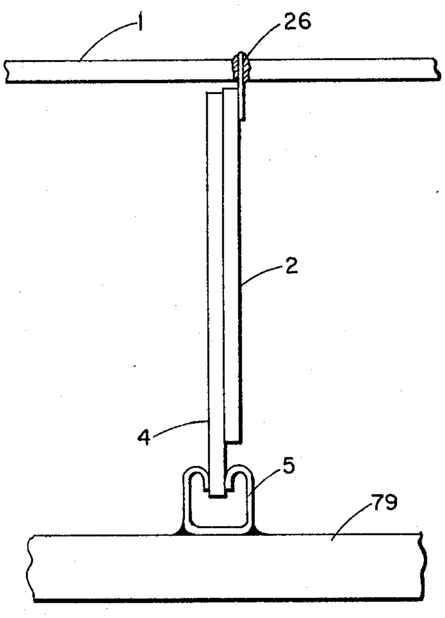
Figure 4A:
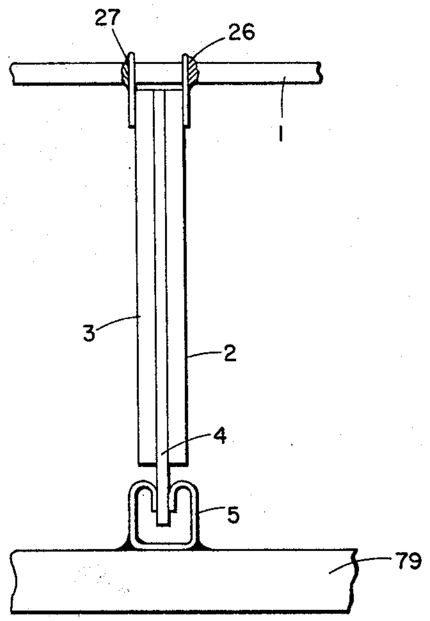

In operation one edge of the board (of relatively high heat conducting material) is inserted into a clip for conducting heat from the board and for holding the board rigidly in place as shown in FIG. 4*c* or the board may be as an alternative (for boards of relatively low heat conducting material) have cemented to the surface opposite the surface with the circuit a thermal conductor which makes contact with the surface to remove heat from the board as shown in FIG. 4*b*. The thermal conductor may also be sandwiched between two circuit boards as shown in FIG. 1 and FIG. 4*a*.

Figure 3:
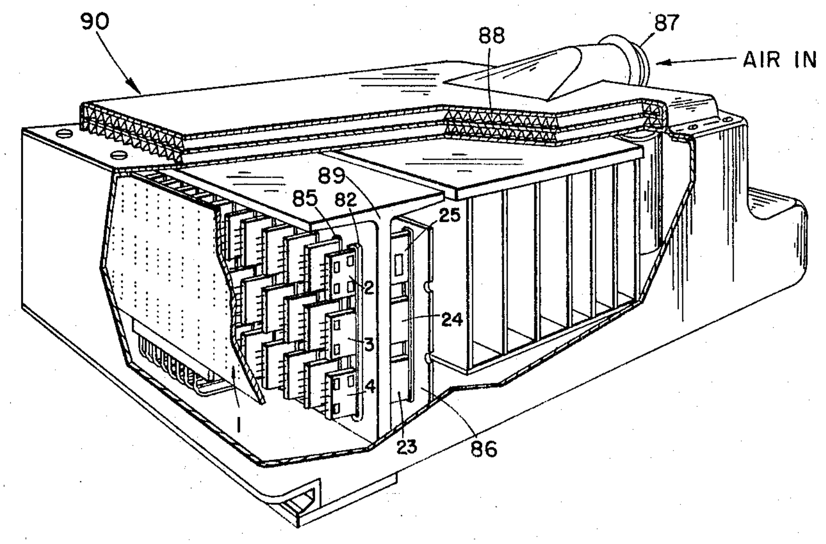
FIG. 3 illustrates additional connectors for removing heat from printed circuit boards.
Figure 2:
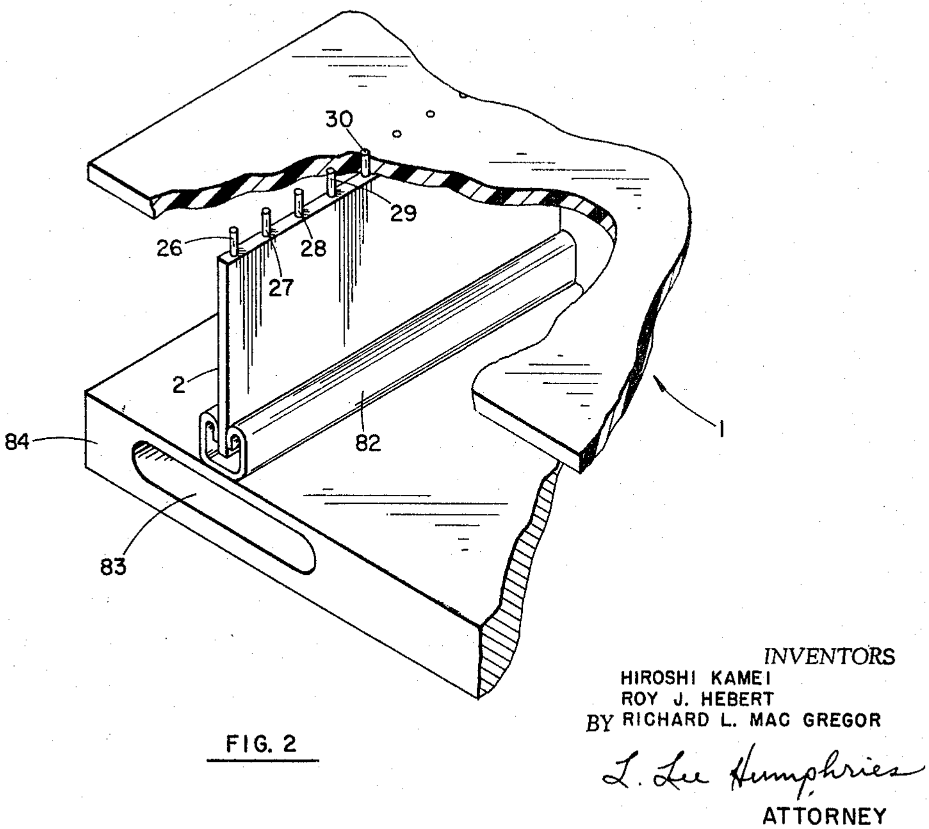
FIG. 2 is an illustration of an electronic package comprising electronic systems having heat removal connectors and supporting connectors.

Thermal conductors 70 through 81 shown in FIG. 1 are each sandwiched between two circuit boards and have a portion extending from the sandwiched combination for mating with a spring clip as shown in FIGS. 2, 3, and 4. When the system is in operation and heat is being generated by the circuitry on the circuit board, the heat enters the thermal conductor which is comprised of a good heat conductor material such as aluminum or silver, and is conducted through the clip into a heat sink. The heat sink or cold plate may be the equipment heat sink or it may be thermally connected by conduction, convection, radiation, or a combination thereof to a central heat sink for various systems or parts of systems comprising a composite piece of equipment.

One embodiment of the system is shown in FIG. 2 wherein is shown a printed circuit board 2 having leads 26, 27, 28, 29, 30 . . . interconnecting to an interconnecting board 1 and plugging into spring metal clip 82 which is affixed to a cold plate or heat sink 84. Conduit 83 extends through heat sink 84 and provides a means for conducting heat therefrom by circulating fluid therethrough.

FIG. 3 is in illustration of another embodiment of the system. A plurality of circuit boards are plugged into a plurality of interconnecting boards. Interconnecting boards 1 and 86 enclose and have attached thereto the plurality of printed circuits boards 2, 3, 4 . . . 23, 24, 25. . . . Spring metal clips 82, 85 . . . hold the boards in place inside the package. Heat is conducted from the printed circuit boards into the clip and into heat sink 89. Air passing inside nozzle 87 and through the plurality of vents 88 conducts the heat from the package to the outside environment and keeps the electronic components operating in reasonably low operating temperatures so as to obtain good performance and reliability. In addition to removing heat, system 90 comprised of the interconnecting boards, plurality of printed circuit boards, spring metal clip, and heat sink, also provides lateral, horizontal, and medium support to the printed circuit boards so that the boards may be packed closer and withstand greater vibrations and shocks to which the system may be subjected in actual operation. Since the boards held by the spring metal clips are not allowed freedom of movement as without the clips, there is less danger when subjected to vibration or shock that the contacts of each board would be pulled loose from the interconnecting board, or that the boards would vibrate and cause contact between two adjacent boards.

Referring now to FIG. 4 wherein is shown in FIG. 4*a* the sandwiched connection of printed circuit boards 2 and 3, interconnecting board 1, thermal conductor 4, spring metal clip 5 and heat sink 79. In FIG. 4*b* only one printed circuit board 2 is utilized. Thermal conductor 4, interconnecting board 1, spring clip 5, and heat sink 79 are equivalent to similar structures shown in FIG. 4*a*. In FIG. 4*c* no thermal conductor is used and the printed circuit board 2 is plugged directly into the spring metal clip 5 which is cemented to a heat sink 79. The printed circuit board or boards, as the case may be, are connected to the interconnecting board 1 by contacts or leads 26, 27 as before. These and other embodiments may be used in order to achieve micro packaging of microminiaturized circuits.

*Summary*

The inventive system is comprised of an interconnecting board having conductor leads and holes for contacts, a plurality of microminiaturized printed circuit boards having contacts extending therefrom, clips attached to a heat sink, and air passages having a connection to said heat sink. The interconnecting board with the plurality of circuit boards connected thereto is plugged into the plurality of clips attached to the heat sink for rigidly supporting the plurality of boards in a micro package and for conducting heat from said plurality of printed circuit boards into said heat sink. The heat may be removed from the heat sink by a plurality of ways, including the circulation of air currents through conduits or vents connected to or through the heat sink.

Although the invention has been illustrated and described in detail, it is to be clearly understood that the same is by way of illustration and example only and is not to be taken by way of limitation, the spirit and scope of this invention being limited only by the terms of the appended claims.

We claim:

1. A system for reliable packaging of electronic equipment comprising:

cold plate means;

a plurality of boards of electrically insulating material having circuits mounted thereto and also having electrical connectors extending from one edge thereof, interconnecting board means having holes therethrough mounting with said extending electrical connectors;

thermal conductor means in thermal contact with one side of each of said plurality of boards; and a plurality of spring clip means attached to said cold plate means holding said thermal conductor means in thermal contact with said cold plate means.

2. A system for reliably removing heat from packaged electronic equipment comprising a cold plate means including thermally conducting paths therethrough;

a plurality of circuit board means including circuit boards having electrical connectors extending from one edge thereof, said boards comprised of an electrically insulating heat conducting material, said boards also grouped into pairs and placed back-to-back, and further wherein said grouped circuit boards are separated by an electrically insulated sheet of thermal conducting material held in a spring clamp, each of said boards in thermal contact with said insulated sheet;

a plurality of spring clip means attached to said cold plate means holding said circuit board means in thermal contact thereon;

interconnecting board means having holes therein mating with said electrical connectors and holding said circuit boards inside said spring clip means.

3. A system for reliably removing heat from packaged electronic systems comprising:

cold plate means comprised of a thermally conductive material;

a plurality of spring clip means attached to said cold plate means and spaced at intervals along at least one side thereof;

a plurality of circuit board means having conductor and resistor patterns formed thereon and having circuits connected to said conductor and resistor patterns, said circuit board means comprised of a heat conducting electrically insulating material, said circuit board means further having electrical connectors extending from one edge thereof and held at the opposite edge by said spring clip means;

interconnecting board means having slots therein mating with said electrical connectors extending from said plurality of circuit board means;

wherein each said circuit means are grouped in pairs of two and placed back-to-back, and wherein a heat conducting insulated metal plate is inserted between said grouped circuit board means and having an edge extending from said circuit board means in a direction opposite from said electrical connectors from said board means being held in said spring clip means, said board means being in thermal contact with said insulated metal plate.

References Cited by the Examiner

UNITED STATES PATENTS

| | | | |
|---|---|---|---|
| 2,912,624 | 11/1959 | Wagner | 317—100 |
| 3,013,186 | 12/1961 | Jones | 317—100 |
| 3,187,226 | 6/1965 | Kates | 317—100 |

FOREIGN PATENTS 607,216 10/1960 Canada.

OTHER REFERENCES

"Stacked, Sealed Used in Sylvania," Electronic Design, June 22, 1960, pp. 28 and 29 relied upon.

ROBERT K. SCHAEFER, *Primary Examiner.*

KATHERINE H. CLAFFY, *Examiner.*

H. J. RICHMAN, M. GINSBURG, *Assistant Examiners.*